US006961128B2

(12) United States Patent
Park

(10) Patent No.: US 6,961,128 B2
(45) Date of Patent: *Nov. 1, 2005

(54) APPARATUS FOR DETECTING CROSS-TALK AND METHOD THEREFOR

(75) Inventor: Christopher Anthony Park, Stowmarket (GB)

(73) Assignee: Agilent Technologies, Inc., Palo Alto, CA (US)

( * ) Notice: Subject to any disclaimer, the term of this patent is extended or adjusted under 35 U.S.C. 154(b) by 328 days.

This patent is subject to a terminal disclaimer.

(21) Appl. No.: 10/325,053

(22) Filed: Dec. 20, 2002

(65) Prior Publication Data

US 2003/0123065 A1 Jul. 3, 2003

(30) Foreign Application Priority Data

Dec. 21, 2001 (EP) .................................. 01310792
Mar. 16, 2002 (EP) .................................. 02251900

(51) Int. Cl.$^7$ .............................................. G01B 9/02

(52) U.S. Cl. ..................................................... 356/454
(58) Field of Search ............................... 356/454, 519, 356/451

(56) References Cited

U.S. PATENT DOCUMENTS 4,790,655 A * 12/1988 Yamamoto et al. ......... 356/451
5,002,395 A * 3/1991 Shah ........................... 356/484
5,367,396 A * 11/1994 Sotom et al. .................. 398/95

FOREIGN PATENT DOCUMENTS

EP          0 818 859    1/1998
JP          57190387     11/1982
WO          WO 01/73980  10/2001

* cited by examiner

Primary Examiner—Andrew H. Lee

(57) ABSTRACT

An apparatus for detecting cross-talk and method therefore, wherein a first and a second output signal from a wavelength selective device are directed to be coincident upon a photodetector. A homodyne beat signal results from the coincidence of the first and the second output signal and the homodyne beat signal is used to measure wavelength drift.

16 Claims, 2 Drawing Sheets

APPARATUS FOR DETECTING CROSS-TALK AND METHOD THEREFOR

FIELD OF THE INVENTION

The present invention relates to an apparatus for the detection of cross-talk, for example of the type sometimes caused by wavelength drift of a laser device or caused by a wavelength selective device in a communications system. The present invention also relates to a method of detecting cross-talk and a use of a homodyne beat signal for the detection of cross-talk.

DISCUSSION OF THE BACKGROUND ART

In an optical communications system, the wavelength of electromagnetic radiation used to communicate a signal is an important parameter. In particular, where a Wavelength Division Multiplexing (WDM) scheme is employed, different signals are respectively communicated using different wavelengths, each different wavelength being known as a channel.

Typically, an array of semiconductor laser devices can be employed in a transmitter unit in order to transmit respective electromagnetic signals over a range of different wavelengths. In addition, or alternatively, a tuneable semiconductor laser device capable of transmitting electromagnetic signals over the range of different wavelengths can be employed in the transmitter unit. Each channel corresponding to each laser device (or the tuneable laser device) is separated from an adjacent channel by a set wavelength separation. For example, on an International Telecommunication Union (ITU) grid, the wavelength separation between adjacent channels is 0.8 nm, which corresponds to a frequency separation of 100 GHz. Other set wavelength separations may be used depending upon the WDM scheme employed, for example, set wavelength separations corresponding to frequency separations of 200 GHz or 50 GHz are known.

In a given WDM scheme, the different electromagnetic signals on different channels are combined into a single transmission stream by a multiplexer which enables the different electromagnetic signals on the different channels of respective different wavelengths to be transmitted through a single optical fibre simultaneously. A remote demultiplexer, for example a wavelength selective device such as an Arrayed Waveguide Grating (AWG), is then used in a transmission link to separate out the different wavelengths corresponding to the electromagnetic signals onto individual spatially separated optical fibres, each optical fibre consequently carrying electromagnetic radiation of a differing wavelength corresponding to a particular channel.

Laser devices employed in transmitters can exhibit wavelength drift as a result of a change in temperature of the laser device or ageing within the laser device itself. The ageing of laser devices can lead to carrier leakage resulting in a gradual change in the refractive index of the laser device which, over time, results in wavelength drift occurring. When wavelength drift occurs, the laser device may transmit an electromagnetic signal at a predominantly incorrect wavelength, resulting in adjacent wavelength channels interfering. The overlapping of adjacent wavelength channels is known as cross-talk.

In order to monitor and control the wavelength drift of the laser device it is known to employ a wavelength dependant element in a closed feedback circuit. The wavelength dependant element can employ interference or dispersion to provide wavelength dependence. In relation to the use of interference to detect wavelength drift, one known apparatus employing a Fabry-Perot etalon in a closed feedback circuit is disclosed in U.S. Pat. No. 5,825,792.

The AWG mentioned above, employed as the remote demultiplexer, may also be susceptible to wavelength drift causing a first given channel at a first spatially positioned output of the AWG to encroach upon/drift into a second given channel at a second spatially positioned output of the AWG adjacent the first given channel. The AWG is linear and when wavelength drift occurs all channels experience the wavelength drift. As the predetermined channel spacing between adjacent channels decreases with increased data modulation rate, the impact of wavelength drift between adjacent channels, i.e. cross-talk, increases.

In order to obviate wavelength drift of the AWG, fine temperature control of the AWG is necessary. Typically, a closed control loop is provided coupled to a thermoelectric cooler, the thermoelectric cooler being thermally coupled to the AWG. In order to implement control, it is clearly necessary to monitor the temperature of the AWG to provide a feedback signal. It is known to use a thermistor to provide such feedback of temperature of the AWG. However, using thermistors, it is difficult to control the temperature of the AWG to within less than one degree Celsius.

SUMMARY OF THE INVENTION

According to a first aspect of the present invention, there is provided an apparatus for detecting cross-talk, the apparatus comprising: a wavelength selective device arranged to receive electromagnetic radiation of a first spectral distribution and provide electromagnetic radiation within a first spectral band at a first output and electromagnetic radiation within a second spectral band at a second output, the first spectral band spectrally overlapping with the second spectral band; and a photodetector for receiving the electromagnetic radiation provided at the first and second outputs; characterised by the electromagnetic radiation in the first spectral band being co-incident upon the photodetector with the electromagnetic radiation in the second spectral band; and a meter circuit for measuring a magnitude of a homodyne beat signal resulting from the coincidence of the electromagnetic radiation within the first and second spectral bands, the magnitude of the homodyne beat signal being indicative of a position of the first spectral distribution relative to the first and second spectral bands. As, in some (but not all) examples, levels of cross-talk are induced by wavelength drift, the detection of cross-talk enables the detection of wavelength drift.

Preferably, the apparatus further comprises a detection circuit for detecting a change in the magnitude of the homodyne beat signal.

Preferably, the wavelength selective device is athermal.

Preferably, the wavelength selective device is also arranged to receive electromagnetic radiation having a second spectral distribution, the electromagnetic radiation of the second spectral distribution being wavelength multiplexed with the electromagnetic radiation of the first spectral distribution.

Preferably, the wavelength of the electromagnetic radiation of the first spectral distribution dithers. More preferably, the dither of the wavelength of the electromagnetic radiation of the first spectral distribution is in accordance with a substantially triangular waveform, for example, a sinusoidal waveform or a triangular waveform.

Preferably, the detection circuit is arranged to determine a direction of a wavelength drift of the electromagnetic radiation of the first spectral distribution, the direction of a wavelength drift being determined from the dither of the wavelength of the electromagnetic radiation of the first spectral distribution and the magnitude and phase of the homodyne beat signal. More preferably, the detection circuit monitors a lower magnitude threshold and an upper magnitude threshold, the direction of the wavelength drift being determined relative to the upper and lower magnitude thresholds.

Preferably, the electromagnetic radiation of the first wavelength distribution comprises first data and the electromagnetic radiation of the second wavelength distribution comprises second data.

According to a second aspect of the present invention, there is provided a communications network comprising the apparatus as set forth above in connection with the first aspect of the present invention.

According to a third aspect of the present invention, there is provided a wavelength division multiplexing system comprising the apparatus as set forth above in connection with the first aspect of the present invention.

According to a fourth aspect of the present invention, there is provided a method of detecting cross-talk, the method comprising the steps of: receiving electromagnetic radiation of a first spectral distribution at a wavelength selective device and providing electromagnetic radiation within a first spectral band at a first output of the wavelength selective device and electromagnetic radiation within a second spectral band at a second output of the wavelength selective device, the first spectral band spectrally overlapping with the second spectral band; and directing the electromagnetic radiation provided at the first and second outputs towards a photodetector; characterised by the electromagnetic radiation in the first spectral band being co-incident upon the photodetector with the electromagnetic radiation in the second spectral band; and measuring a magnitude of a homodyne beat signal resulting from the coincidence of the electromagnetic radiation within the first and second spectral bands, the magnitude of the homodyne beat signal being indicative of a position of the first spectral distribution relative to the first and second spectral bands.

Preferably, the method further comprises the step of: detecting a change in the magnitude of the homodyne beat signal.

According to a fifth aspect of the present invention, there is provided a method of controlling wavelength drift of a source of electromagnetic radiation, the method comprising the steps of: detecting cross-talk according to the method set forth in the fourth aspect of the present invention; and generating a control signal to alter a parameter of the source of the electromagnetic radiation so as to maintain the position of the first spectral distribution relative to the first and second spectral bands.

According to a sixth aspect of the present invention, there is provided a method of controlling cross-talk in a wavelength selective device, the method comprising the steps of: detecting cross-talk set according to the method set forth in the fourth aspect of the present invention; and generating a control signal to alter a parameter of the wavelength selective device so as to maintain the position of the first spectral distribution relative to the first and second spectral bands.

According to a seventh aspect of the present invention, there is provided a use of a homodyne beat signal to identify wavelength drift.

According to an eighth aspect of the present invention, there is provided a use of a dither signal in combination with a homodyne beat signal in order to determine a direction of wavelength drift.

According to a ninth aspect of the present invention, there is provided a homodyne beat signal formed by coincidence of a first optical signal output by a wavelength selective device upon a photodetector with a second optical signal output by the wavelength selective device.

It is thus possible to provide an apparatus and method for detecting wavelength drift providing a more accurate feedback signal than provided by known apparatus and methods, thereby facilitating temperature control to a degree of accuracy of less than one degree Celsius. The present invention can be integrated into a control loop apparatus for monitoring and controlling cross-talk between adjacent channels of a communications system. Improved control of wavelength drift is also thus possible without the need for complicated arrangements incorporating optical components. Furthermore, fewer components are required to detect wavelength drift and hence a compact apparatus can be produced. The apparatus and methods are also more suited to optoelectronic integration than known apparatus and methods based on dielectric filters. Consequently, wavelength drift is obviated or at least mitigated.

It should be understood that any references herein to "electromagnetic radiation" are intended to embrace any suitable wavelengths of electromagnetic radiation compatible with a wavelength selective device, for example but not limited exclusively to, light having wavelengths between about 300 nm and about 10 $\mu$m, such as wavelengths between about 800 nm and about 1700 nm.

At least one embodiment of the present invention will now be described, by way of example only, with reference to the accompanying drawings, in which:

BRIEF DESCRIPTION OF THE DRAWINGS

Throughout the following description, identical reference numerals shall be used to identify like parts.

DETAILED DESCRIPTION OF THE PREFERRED EMBODIMENT

Figure 1:
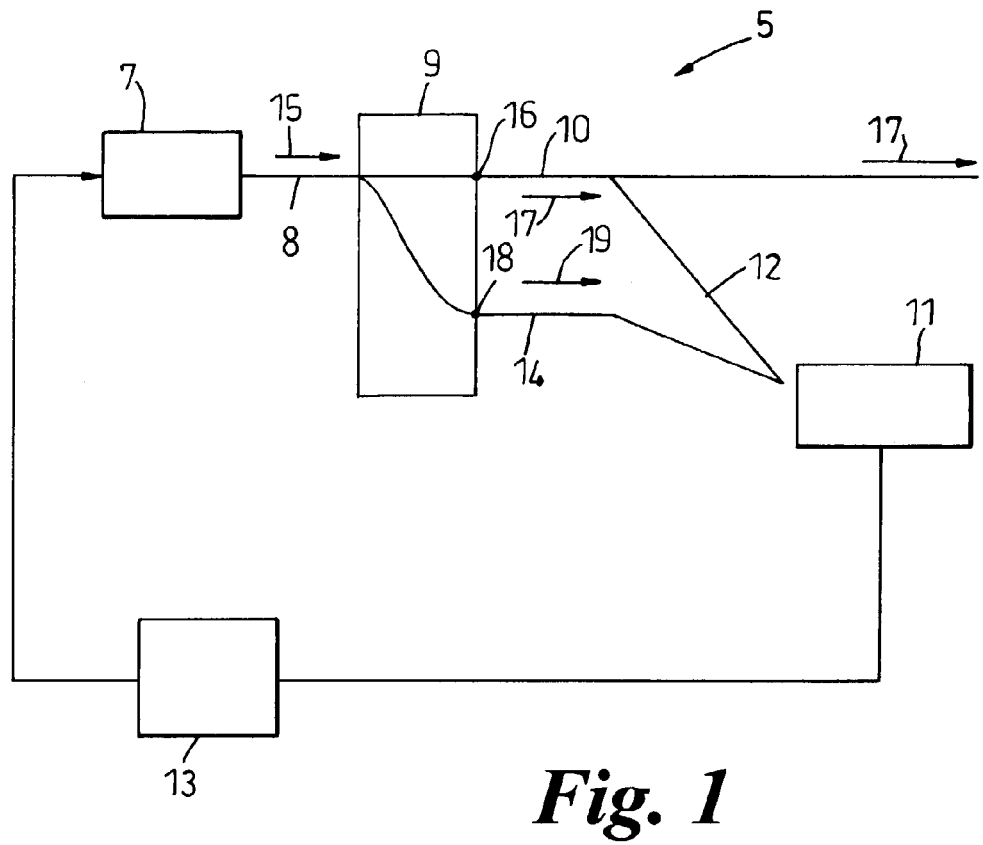
FIG. 1 is a schematic diagram of a laser wavelength locking control loop apparatus constituting a first embodiment of the present invention.

Referring to FIG. 1, a laser wavelength locking control loop apparatus 5 comprises a laser device 7, for example a tuneable semiconductor laser coupled by a first optical fibre 8 to an input port of an athermal wavelength selective device 9 such as an athermal Arrayed Waveguide Grating (AWG) as disclosed in the publication, "Athermal polarization—independent all-polymer arrayed waveguide grating (AWG) multi/demultiplexer" by Keil et al, Optical Fibre Communications (OFC), Post Deadline paper number 7 (PD7), 2001". A first end of a second optical fibre 10 is coupled to a first output port 16 and a first end of a third optical fibre 14 is coupled to a second output port 18 of the wavelength selective device 9. A 90/10 splitter (not shown) is coupled to the second optical fibre 10 and a first end of a fourth optical fibre 12 is coupled to the 90/10 splitter. A second end of the third optical fibre 14 and a second end of the fourth optical fibre 12 are disposed close to a detector 11, such as a photodetector. The detector 11 is coupled to a feedback controller circuit 13 which can be, but is not limited to, a PID or dither circuit controller. The feedback controller circuit 13 is coupled to the laser device 7.

Figure 3:
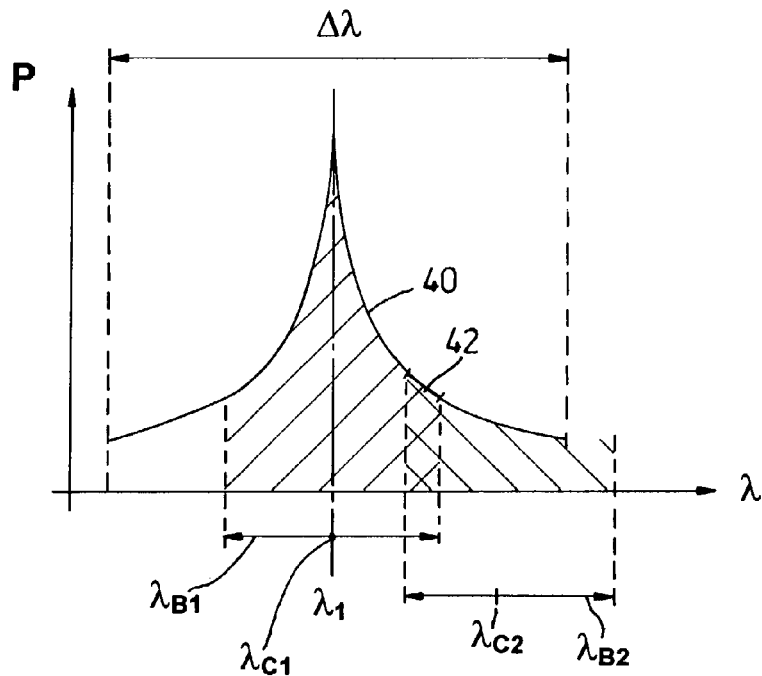
FIG. 3 is a schematic diagram of a first wavelength distribution illustrating positioning of the first wavelength distribution relative to wavelength bands of a wavelength selective device.

In operation, the laser device 7 transmits a first electromagnetic signal 15. Referring to FIG. 3, the first electromagnetic signal 15 has a first wavelength distribution 40 and is transmitted at, for example, a predetermined designated wavelength having a peak, central wavelength $\lambda_1$ within a spread of wavelengths $\Delta\lambda$. The first electromagnetic signal 15 propagates via the first optical fibre 8 to the wavelength selective device 9 which directs received electromagnetic radiation having wavelengths that lie within a first spectral band $\lambda_{B1}$, having a first central wavelength $\lambda_{C1}$ to the first output port 16 and wavelengths that lie within a second spectral band $\lambda_{B2}$ having a second central wavelength $\lambda_{C2}$ to the second output port 18. The first and second central wavelengths $\lambda_{C1}$, $\lambda_{C2}$ are separated from each other by a predetermined channel spacing, for example 0.8 nm, thereby providing a high degree of spatial isolation between adjacent channels. Nevertheless, the first spectral band $\lambda_{B1}$ overlaps with the second spectral band $\lambda_{B2}$ and a relative position between the first spectral distribution 40 and the first and second spectral bands $\lambda_{B1}$, $\lambda_{B2}$ exists. Due to the overlap between the first and second spectral bands $\lambda_{B1}$, $\lambda_{B2}$, a first portion 42 of the first spectral distribution 40 lies within both the first and second spectral bands $\lambda_{B1}$, $\lambda_{B2}$.

It should be appreciated that although, in this example, the spacing between adjacent channels is 0.8 nm (100 GHz), the channel spacing can be smaller or larger depending upon the WDM scheme employed. The accuracy in the detection of cross-talk is determined by the cross-talk characteristics of the wavelength selective device 9 used.

During normal operation, the wavelength selective device 9 provides a first output signal 17, of which the peak central wavelength $\lambda_1$ substantially coincides with the first central wavelength $\lambda_{C1}$, at the first output port 16 and corresponding to a first channel. The first output signal 17 has a power $P_1$. At the second output port 18 of the wavelength selective device 9, a second output signal 19 with a power $P_2$ is provided and corresponds to a second channel. The power $P_2$ of the second output signal 19 is a small signal generated as a result of cross-talk performance of the wavelength selective device 9.

As mentioned above, when the laser device 7 is operating at the predetermined designated wavelength, the peak central wavelength $\lambda_1$ substantially coincides with the first central wavelength $\lambda_{C1}$ of the first spectral band $\lambda_{B1}$. When the laser device 7 is not operating at the predetermined designated wavelength constituting drift of the spectral distribution 40 of the first electromagnetic signal 15, the peak central wavelength $\lambda_1$ does not substantially coincide with the first central wavelength $\lambda_{C1}$ of the first spectral band $\lambda_{B1}$. Consequently, the relative position of the spectral distribution 40 to the first and second spectral bands $\lambda_{B1}$, $\lambda_{B2}$ has changed and a different portion (not shown) of the first spectral distribution 40 lies within both the first and second spectral bands $\lambda_{B1}$, $\lambda_{B2}$ as the spectral distribution 40 drifts towards the second spectral band $\lambda_{B2}$.

On exiting the wavelength selective device 9, the first output signal 17 is split by the 90/10 splitter to enable a proportion of the first output signal 17 to be received by the detector 11 whilst the remainder of the first output signal 17 continues along its propagation path, the destination of which is not important for the purposes of this example. The second output signal 19 is also received by the detector 11, and at the detector 11 the first output signal 17 and the second output signal 19 are coincident so as to combine.

As a result of the combination of the first output signal 17 and the second output signal 19 at the detector 11, a homodyne beat signal is produced having a first intensity, or magnitude, $I_{beat1}$ proportional to the square root of the product $(P_1 P_2)$, where $P_1$ and $P_2$ are as defined above. The homodyne beat signal is used as an indicator of the amount of wavelength drift and hence the cross-talk experienced by the laser device 7 as shown in the following examples.

Typically, for ITU channel spacings of 0.8 nm, the cross-talk between adjacent wavelength channels, where no wavelength drift occurs, is −20 dB ($\frac{1}{100}^{th}$) of the power $P_1$ of the signal. Given a power of 1 mW (0 dBm) for the power of $P_1$ of the first electromagnetic signal 15 and therefore a power of 0.01 mW (−20 dBm) for the power $P_2$ of the second output signal 17 constituting cross-talk, the homodyne beat signal produced under normal operation has an intensity of 0.1 mW (−10 dBm).

If the wavelength of the laser device 7 drifts such that the spectral distribution 40 drifts towards the second spectral band $\lambda_{B2}$ as described above and the different portion (not shown) of the first spectral distribution 40 lies within the first and second spectral bands $\lambda_{B1}$, $\lambda_{B2}$, the power $P_1$ falls to 0.90 mW (−0.5 dBm) and the power $P_2$ of the cross-talk consequently increases to, for example, 0.1 mW (−10 dBm). Consequently, the first intensity, $I_{beat1}$, of the homodyne beat signal changes to 0.3 mW (−5 dBm), indicating an increase in cross-talk between adjacent channels and thus the presence of wavelength drift of the laser device 7. Thus, the homodyne beat signal can be used as a sensitive monitor of the degree of cross-talk and hence wavelength drift of the laser device 7. In order to detect cross-talk in a second direction, a third channel output port (not shown) corresponding to a third (not shown) can be provided adjacent the first output port 16, on an opposite side of the first output port 16 to the second output port 18. A portion of the first output signal can be directed towards a second detector (not shown) so as to be co-incident with a third output signal from the third output port also directed towards the second detector. The resulting homodyne beat signal created can then be monitored to determine if wavelength drift is occurring in the second direction.

In response to the electromagnetic radiation incident thereupon, the detector 11 generates a feedback signal in the form of a current to the feedback controller circuit 13. The feedback controller circuit 13 comprises a measuring circuit (not shown) that measures the first intensity $I_{beat1}$ of the homodyne beat signal. If the homodyne beat signal is below a specified threshold value, for example 0.1 mW (−10 dBm), the feedback control circuit 13 generates an error signal of substantially zero value, indicative of substantially no wavelength drift, in response to the measurement of the feedback signal output generated by the detector 11. If the homodyne beat signal has changed to a level above or equal to the specified threshold value, the feedback controller circuit 13 detects a change in the measured feedback signal and generates an error signal of non-zero value, indicative of wavelength drift occurring, in response to the feedback signal generated by the detector 11. The error signal generated by the feedback controller circuit 13 is processed by the feedback controller circuit 13 in order to generate a control signal for altering a parameter of the laser device 7, such as a temperature or tuning current, in order to control the wavelength of the first electromagnetic signal 15. Consequently, the above laser wavelength locking control loop apparatus 5 ensures that the peak central wavelength $\lambda_{C1}$ of the first electromagnetic signal 15 emitted by the laser device 7 substantially coincides with the central wavelength $\lambda_C$, thereby substantially eliminating cross-talk. It should be understood that, in the alternative examples, the error signal can be used as the control signal.

In order to determine direction of the wavelength drift, the laser device 7 can be manipulated to dither the first spectral distribution 40 at a relatively low frequency with respect to the frequency of the first electromagnetic signal 15, for example 100 kHz. The dither is about the peak central wavelength $\lambda_1$ and is achieved by altering the temperature of the laser device 7, or the injection current(s) of the laser device 7, using a dither signal. The dither signal, in this example, is a triangular waveform, such as a periodic triangular waveform. The provision of the dither results in a controlled translation of the first spectral distribution 40 relative to the first and second spectral bands $\lambda_{B1}$, $\lambda_{B2}$. Consequently, a controlled change in cross-talk is introduced; the power changes of the cross-talk can therefore be expected. In order to determine the direction of the wavelength drift a lower threshold and an upper threshold can be provided instead of the specified threshold value mentioned above. If the power of the homodyne beat signal is between the upper and lower thresholds, this is indicative of no significant cross-talk existing, any change in cross-talk measured between the upper and lower thresholds being as a result of the dither signal.

In contrast, if the power of the homodyne beat signal is above the upper threshold, this is indicative of wavelength drift towards the second channel from the first channel. Consequently, and by deduction, if the power of the homodyne beat signal is below the lower threshold, the wavelength drift must be in the opposite direction than towards the second channel with respect to the first channel. The feedback controller circuit 13 being the source of the dither signal is in synchronism with the measurements of the first intensity $I_{beat1}$ of the homodyne beat signal and so is able to make the determination as to the direction of the wavelength drift. In this example, the error signal includes an indication of the direction of the wavelength drift, for example by polarity of the error signal, as well as magnitude of the wavelength drift. The indication of the direction of wavelength drift is used by the feedback controller 13 in order to set the control signal so as to control the direction in which the parameter of the laser device 7 is altered.

Figure 2:
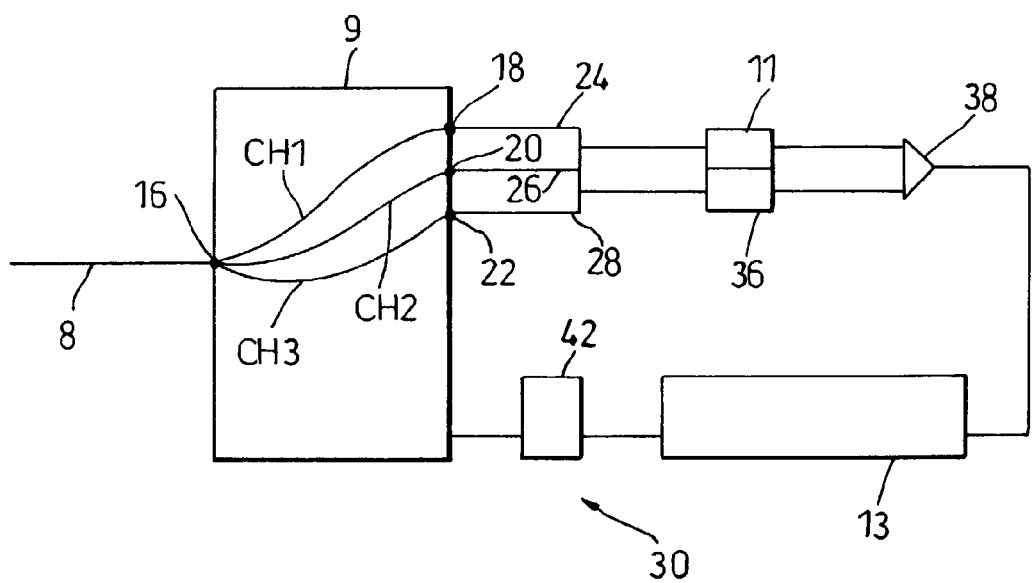
FIG. 2 is a schematic diagram of a demultiplexer employing an AWG constituting a second embodiment of the present invention.

Referring to FIG. 2, a communications system employing a WDM scheme includes a demultiplexer 30. The demultiplexer 30 comprises a non-athermal wavelength selective device 9, for example an AWG that is not athermal having an input port 16 for receiving a multiplexed input signal (not shown) via the first optical fibre 8 coupled to the input port 16. The multiplexed input signal comprises N individual data signals corresponding to N spectral distributions respectively having N peak central wavelengths $\lambda_1, \ldots, \lambda_N$; the multiplexed input signal is received by the wavelength selective device 9.

The wavelength selective device 9 comprises N output ports corresponding to N channels. Of the N channels, it is necessary to monitor at least two channels, but preferably three channels. In this example, for the sake of completeness, the monitoring of three channels will be described, for example, a first channel CH1, a second channel CH2 and a third channel CH3 corresponding to a first output port 18, a second output port 20 and a third output port 22, respectively. The first channel CH1 corresponds to a first central wavelength $\lambda_{C1}$, the second channel CH2 corresponds to a second central wavelength $\lambda_{C2}$ and the third channel CH3 corresponds to a third central wavelength $\lambda_{C3}$ (not shown).

A first end of a first output optical fibre 24 is coupled to the first output port 18. A first end of a second output optical fibre 26 is coupled to the second output port 20 and a first end of a third output optical fibre 28 is coupled to the third output port 22. The first output optical fibre 24 is coupled to a first splitter (not shown) such as a 90/10 splitter. The second output optical fibre 26 is coupled to a second splitter (not shown) and a third splitter (not shown) such as 90/10 splitter(s). Similarly, the third output optical fibre 28 is coupled to a fourth splitter (not shown), such as a 90/10 splitter.

The first photodetector 11 is disposed adjacent and in close proximity to an output of the first splitter coupled to the first output optical fibre 24. The first photodetector 11 is also disposed adjacent and in close proximity to an output of the second splitter coupled to the second output optical fibre 26.

A second photodetector 36 is disposed adjacent the first photodetector 11 and in close proximity to an output of the third splitter coupled to the second output optical fibre 26. The second photodetector 36 is also disposed adjacent and in close proximity to an output of the third splitter coupled to the third output optical fibre 28.

Although, in this example, splitters are coupled to the first, second and third output optical fibres 24,26,28, it should be appreciated that substantially entire signals present at the first, second and third output ports 18,20,22 can be used to monitor wavelength if it is desirable to dedicate the signals present at the first, second and third output ports 18,20,22 to monitoring wavelength. In the above example, respectively small proportions of the signals present at the first, second and third output ports 18,20,22 are directed towards the first and second photodetectors 11,36. The uses of the remaining proportion of the signals present at the first, second and third output ports 18,20,22 are not important for the purpose of describing the examples herein and so shall not be described further.

The first photodetector 11 is coupled to a first input terminal of an amplifier arrangement 38. The amplifier arrangement 38 is a typical configuration in the art and so will not be described further. The second photodetector 36 is coupled to a second input terminal of the first amplifier arrangement 38. An output terminal of the amplifier arrangement 38 is coupled to the feedback controller circuit 13 which can be, but is not limited to, a PID or dither circuit controller. The feedback controller circuit 13 is coupled to a ThermoElectric Cooler (TEC) 42, for example a Peltier device, the TEC 42 being thermally coupled to the wavelength selective device 9

In operation, the multiplexed input signal propagates via the first input optical fibre 8 to the input port 16 of the wavelength selective device 9. A first optical output signal corresponding to the first channel CH1 propagates through the first output optical fibre 24 and is incident upon the first photodetector 11. A second optical output signal corresponding to the second channel CH2 propagates through the second output optical fibre 26 and is split by the splitter to produce a first portion of the second optical output signal and a second portion of the second optical output signal. The first portion of the second optical output signal is incident upon the first photodetector 11 and therefore coincident with the first optical output signal also incident upon the first photodetector 11. The second portion of the second optical output signal is incident upon the second photodetector 36. A third optical output signal corresponding to the third channel CH3 propagates through the third output optical fibre 28 and is also incident upon the second photodetector 36 and therefore coincident with the second portion of the second optical output signal.

For the purposes of simplicity and clarity of description, the measurement of cross-talk between adjacent channels of the wavelength selective device 9 will now be described in relation to the first and second channels CH1, CH2. The explanation will be extended to the third channel CH3 thereafter.

Figure 4:
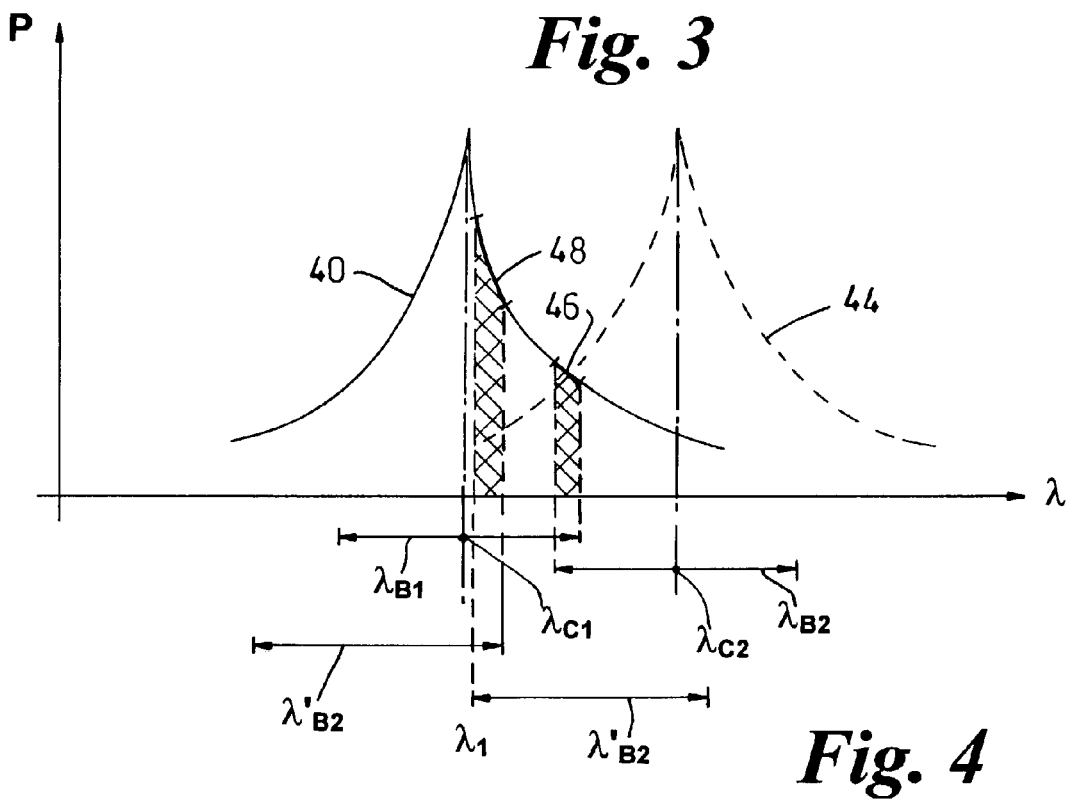
FIG. 4 is a schematic diagram of the first wavelength distribution and a second wavelength distribution illustrating positioning of the first and second wavelength distributions relative to wavelength bands of the wavelength selective device.

Using the nomenclature introduced in the description of the operation of FIG. 1, the first spectral distribution 40 also corresponds to the first channel CH1. Similarly, a second spectral distribution 44 (FIG. 4) corresponds to the second channel CH2. As previously described, the first channel CH1 corresponds to a first spectral band $\lambda_{B1}$ and the second channel CH2 corresponds to a second spectral band $\lambda_{B2}$. During normal operation, the wavelength selective device 9 provides electromagnetic radiation of the first spectral distribution 40 that lies within the first spectral band $\lambda_{B1}$ at the first output port 18. Similarly, electromagnetic radiation of the second spectral distribution 44 that lies within the second spectral band $\lambda_{B2}$ is directed to the second output port 20. Assuming no wavelength drift has occurred, a nominal amount of cross-talk between the first and second channels CH1, CH2 will be present.

Should wavelength drift occur in a first direction, for example, towards the first channel CH1, i.e. towards the lower end of the electromagnetic spectrum, the relative position of the first spatial distribution 40 relative the first and second spectral bands changes (as signified by a new first spectral band $\lambda'_{B1}$ and a new second spectral band $\lambda'_{B2}$). Consequently, the area of overlap of the new first and second spectral bands $\lambda'_{B1}, \lambda'_{B2}$ coincides with a different portion 48 of the first spectral distribution 40. Therefore, when the first optical output signal coincides with the first portion of the second optical output signal on the first photodetector 11, a first homodyne beat signal is created which differs from that produced before wavelength drift occurred. The first homodyne beat signal has a second intensity, or magnitude, $I_{beat2}$, proportional to the square root of the product (P1P2) where P1 and P2 are as defined above.

Should the wavelength drift occur in a second direction, for example, towards the upper end of the electromagnetic spectrum, the coincidence of the third optical output signal with the second portion of the second optical output signal on the second photodetector 36 results in a second homodyne beat signal being produced having a third intensity, or magnitude, $I_{beat3}$ proportional to the square root of the product (P1P3) where P1 is as defined above and P3 is the power of the third optical output signal. Consequently, if wavelength drift has occurred, the direction of the wavelength drift can be easily determined.

Taking the example of the wavelength drift in the first direction, the first photodetector 11 generates a first electrical current signal in response to the first intensity, $I_{beat1}$, of the first homodyne beat signal at substantially zero frequency, the first electrical current signal being applied to the first terminal of the amplifier arrangement 38. In response to the negligible intensity of the second homodyne beat signal, the second photodetector 36 generates a second electrical current signal that is applied to the second terminal of the amplifier arrangement 38.

The amplifier arrangement 38 generates a single voltage output signal reflecting a difference between the first or second current signals respectively received from the first and the second photodetectors 11, 36, the output voltage signal being applied to the feedback controller circuit 13. The output voltage signal is indicative of the direction and a magnitude of wavelength drift. The voltage output signal is processed by the feedback controller circuit 13 in order to generate a control signal for altering a parameter, for example, temperature of the wavelength selective device 9, by applying a voltage across the TEC 42 so as to initiate cooling or heating of the wavelength selective device 9. The temperature of the wavelength selective device 9 is therefore altered in response to the magnitude and direction of the wavelength drift. Cross-talk can thus be reduced or eliminated. It should be appreciated that the above detection of change of wavelength drift operates analogous in the second direction of wavelength drift.

An alternative way of determining direction of wavelength drift, is to provide a dither signal as already described above in relation to FIG. 1. Consequently, the laser device 7 (not shown in FIG. 2) can be manipulated by the feedback controller 13 so as to dither the first central wavelength $\lambda_1$ of the first wavelength distribution 40 at a relatively low frequency with respect to the frequency of the multiplexed input signal, for example 100 kHz so that the dither frequency is not close to the frequency of a data stream borne by the first wavelength distribution 40. The dither can be achieved and used in a like manner to that already described above in connection with FIG. 1. Thus, direction of wavelength drift can be determined without a need for the second photodetector 36; the TEC 42 can therefore still be appropriately controlled.

What is claimed is:

1. An apparatus for detecting cross-talk drift, the apparatus comprising:

a wavelength selective device arranged to receive electromagnetic radiation of a first spectral distribution and provide electromagnetic radiation within a first spectral band at a first output and electromagnetic radiation within a second spectral band at a second output, the first spectral band spectrally overlapping with the second spectral band, wherein the wavelength selective device is athermal;

a photodetector for receiving the electromagnetic radiation provided at the first and second outputs, wherein the electromagnetic radiation in the first spectral band is co-incident upon the photodetector with the electromagnetic radiation in the second spectral band; and a meter circuit for measuring a magnitude of a homodyne beat signal resulting from the coincidence of the electromagnetic radiation within the first and second spectral bands, the magnitude of the homodyne beat signal being indicative of a position of the first spectral distribution relative to the first and second spectral bands.

2. An apparatus as claimed in claim 1, further comprising a detection circuit for detecting a change in the magnitude of the homodyne beat signal.

3. An apparatus for detecting cross-talk drift, the apparatus comprising:

a wavelength selective device arranged to receive electromagnetic radiation of a first spectral distribution and provide electromagnetic radiation within a first spectral band at a first output and electromagnetic radiation within a second spectral band at a second output, the first spectral band spectrally overlapping with the second spectral band;

a photodetector for receiving the electromagnetic radiation provided at the first and second outputs, wherein the electromagnetic radiation in the first spectral band is co-incident upon the photodetector with the electromagnetic radiation in the second spectral band; and a meter circuit for measuring a magnitude of a homodyne beat signal resulting from the coincidence of the electromagnetic radiation within the first and second spectral bands, the magnitude of the homodyne beat signal being indicative of a position of the first spectral distribution relative to the first and second spectral bands, wherein the wavelength selective device is also arranged to receive electromagnetic radiation having a second spectral distribution, the electromagnetic radiation of the second spectral distribution being wavelength multiplexed with the electromagnetic radiation of the first spectral distribution.

4. An apparatus for detecting cross-talk drift, the apparatus comprising:

a wavelength selective device arranged to receive electromagnetic radiation of a first spectral distribution and provide electromagnetic radiation within a first spectral band at a first output and electromagnetic radiation within a second spectral band at a second output, the first spectral band spectrally overlapping with the second spectral band;

a photodetector for receiving the electromagnetic radiation provided at the first and second outputs, wherein the electromagnetic radiation in the first spectral band is co-incident upon the photodetector with the electromagnetic radiation in the second spectral band; and a meter circuit for measuring a magnitude of a homodyne beat signal resulting from the coincidence of the electromagnetic radiation within the first and second spectral bands, the magnitude of the homodyne beat signal being indicative of a position of the first spectral distribution relative to the first and second spectral bands, wherein a wavelength of the electromagnetic radiation of the first spectral distribution dithers.

5. An apparatus as claimed in claim 4, wherein the dither of the wavelength of the electromagnetic radiation of the first spectral distribution is in accordance with a triangular waveform.

6. An apparatus as claimed in claim 4, further comprising a detection circuit for detecting a change in the magnitude of the homodyne beat signal, wherein the detection circuit is arranged to determine a direction of a wavelength drift of the electromagnetic radiation of the first spectral distribution, the direction of a wavelength drift being determined from the dither of the wavelength of the electromagnetic radiation of the first spectral distribution and the magnitude and a phase of the homodyne beat signal.

7. An apparatus as claimed in claim 6, wherein the detection circuit monitors a lower magnitude threshold and an upper magnitude threshold, the direction of the wavelength drift being determined relative to the upper and lower magnitude thresholds.

8. An apparatus as claimed in claim 1 wherein the electromagnetic radiation of the first wavelength distribution comprises first data and the electromagnetic radiation of the second wavelength distribution comprises second data.

9. A communications network comprising an apparatus for detecting cross-talk drift, the apparatus comprising:

a wavelength selective device arranged to receive electromagnetic radiation of a first spectral distribution and provide electromagnetic radiation within a first spectral band at a first output and electromagnetic radiation within a second spectral band at a second output, the first spectral band spectrally overlapping with the second spectral band, wherein the wavelength selective device is athermal;

a photodetector for receiving the electromagnetic radiation provided at the first and second outputs, wherein the electromagnetic radiation in the first spectral band is co-incident upon the photodetector with the electromagnetic radiation in the second spectral band; and a meter circuit for measuring a magnitude of a homodyne beat signal resulting from the coincidence of the electromagnetic radiation within the first and second spectral bands, the magnitude of the homodyne beat signal being indicative of a position of the first spectral distribution relative to the first and second spectral bands.

10. A wavelength division multiplexing system comprising an apparatus for detecting cross-talk drift, the apparatus comprising:

a wavelength selective device arranged to receive electromagnetic radiation of a first spectral distribution and provide electromagnetic radiation within a first spectral band at a first output and electromagnetic radiation within a second spectral band at a second output, the first spectral band spectrally overlapping with the second spectral band, wherein the wavelength selective device is athermal;

a photodetector for receiving the electromagnetic radiation provided at the first and second outputs, wherein the electromagnetic radiation in the first spectral band is co-incident upon the photodetector with the electromagnetic radiation in the second spectral band; and a meter circuit for measuring a magnitude of a homodyne beat signal resulting from the coincidence of the electromagnetic radiation within the first and second spectral bands, the magnitude of the homodyne beat signal being indicative of a position of the first spectral distribution relative to the first and second spectral bands.

11. A method of detecting cross-talk, the method comprising:

receiving electromagnetic radiation of a first spectral distribution at a wavelength selective device and providing electromagnetic radiation within a first spectral band at a first output of the wavelength selective device and electromagnetic radiation within a second spectral band at a second output of the wavelength selective device, the first spectral band spectrally overlapping with the second spectral band, wherein the wavelength selective device is athermal;

directing the electromagnetic radiation provided at the first and second outputs towards a photodetector, wherein the electromagnetic radiation in the first spectral band is co-incident upon the photodetector with the electromagnetic radiation in the second spectral band; and measuring a magnitude of a homodyne beat signal resulting from the coincidence of the electromagnetic radiation within the first and second spectral bands, the magnitude of the homodyne beat signal being indicative of a position of the first spectral distribution relative to the first and second spectral bands.

12. A method as claimed in claim 11, further comprising:
detecting a change in the magnitude of the homodyne beat signal.

13. A method of controlling wavelength drift of a source of electromagnetic radiation, the method comprising the steps of:
detecting cross-talk by (a) receiving electromagnetic radiation of a first spectral distribution at a wavelength selective device and providing electromagnetic radiation within a first spectral band at a first output of the wavelength selective device and electromagnetic radiation within a second spectral band at a second output of the wavelength selective device, the first spectral band spectrally overlapping with the second spectral band, wherein the wavelength selective device is athermal; (b) directing the electromagnetic radiation provided at the first and second outputs towards a photodetector, wherein the electromagnetic radiation in the first spectral band is co-incident upon the photodetector with the electromagnetic radiation in the second spectral band; and (c) measuring a magnitude of a homodyne beat signal resulting from the coincidence of the electromagnetic radiation within the first and second spectral bands, the magnitude of the homodyne beat signal being indicative of a position of the first spectral distribution relative to the first and second spectral bands; and
generating a control signal to alter a parameter of the source of the electromagnetic radiation so as to maintain the position of the first spectral distribution relative to the first and second spectral bands.

14. A method of controlling cross-talk created by wavelength selective device, the method comprising the steps of:
detecting cross-talk by (a) receiving electromagnetic radiation of a first spectral distribution at a wavelength selective device and providing electromagnetic radiation within a first spectral band at a first output of the wavelength selective device and electromagnetic radiation within a second spectral band at a second output of the wavelength selective device, the first spectral band spectrally overlapping with the second spectral band, wherein the wavelength selective device is athermal; (b) directing the electromagnetic radiation provided at the first and second outputs towards a photodetector, wherein the electromagnetic radiation in the first spectral band is co-incident upon the photodetector with the electromagnetic radiation in the second spectral band; and (c) measuring a magnitude of a homodyne beat signal resulting from the coincidence of the electromagnetic radiation within the first and second spectral bands, the magnitude of the homodyne beat signal being indicative of a position of the first spectral distribution relative to the first and second spectral bands; and
generating a control signal to alter a parameter of the wavelength selective device so as to maintain the position of the first spectral distribution relative to the first and second spectral bands.

15. A method of identifying cross-talk comprising:
receiving electromagnetic radiation of a first spectral distribution at a wavelength selective device and providing electromagnetic radiation within a first spectral band at a first output of the wavelength selective device and electromagnetic radiation within a second spectral band at a second output of the wavelength selective device, the first spectral band spectrally overlapping with the second spectral band, wherein the wavelength selective device is athermal;
directing the electromagnetic radiation provided at the first and second outputs towards a photodetector, wherein the electromagnetic radiation in the first spectral band is co-incident upon the photodetector with the electromagnetic radiation in the second spectral band;
measuring a magnitude of a homodyne beat signal resulting from the coincidence of the electromagnetic radiation within the first and second spectral bands, the magnitude of the homodyne beat signal being indicative of a position of the first spectral distribution relative to the first and second spectral bands; and
detecting a change in the magnitude of the homodyne beat signal.

16. A method for determining a direction of wavelength drift comprising:
receiving electromagnetic radiation of a first spectral distribution at a wavelength selective device and providing electromagnetic radiation within a first spectral band at a first output of the wavelength selective device and electromagnetic radiation within a second spectral band at a second output of the wavelength selective device, the first spectral band spectrally overlapping with the second spectral band, wherein the wavelength of the electromagnetic radiation of the first spectral distribution dithers;
directing the electromagnetic radiation provided at the first and second outputs towards a photodetector, wherein the electromagnetic radiation in the first spectral band is co-incident upon the photodetector with the electromagnetic radiation in the second spectral band;
measuring a magnitude of a homodyne beat signal resulting from the coincidence of the electromagnetic radiation within the first and second spectral bands, the magnitude of the homodyne beat signal being indicative of a position of the first spectral distribution relative to the first and second spectral bands; and
detecting a change in the magnitude of the homodyne beat signal to determine a direction of a wavelength drift of the electromagnetic radiation of the first spectral distribution, the direction of a wavelength drift being determined from the dither of the wavelength of the electromagnetic radiation of the first spectral distribution and the magnitude and a phase of the homodyne beat signal.

* * * * *